United States Patent
Fujii et al.

(10) Patent No.: US 11,658,082 B2
(45) Date of Patent: May 23, 2023

(54) WIRING SUBSTRATE AND METHOD OF MANUFACTURING THE SAME

(71) Applicant: NGK SPARK PLUG CO., LTD., Nagoya (JP)

(72) Inventors: Hirotake Fujii, Nagoya (JP); Yutaka Kachi, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 599 days.

(21) Appl. No.: 16/715,693

(22) Filed: Dec. 16, 2019

(65) Prior Publication Data

US 2020/0211915 A1     Jul. 2, 2020

(30) Foreign Application Priority Data

Dec. 27, 2018    (JP) .............................. JP2018-244510

(51) Int. Cl.
     *H05K 1/03*         (2006.01)
     *H01L 23/13*       (2006.01)
     (Continued)

(52) U.S. Cl.
     CPC .......... *H01L 23/13* (2013.01); *H01L 21/4807* (2013.01); *H05K 3/0052* (2013.01); *H05K 1/0306* (2013.01); *H05K 2201/09027* (2013.01)

(58) Field of Classification Search
     CPC ... H01L 23/13; H01L 21/4807; H05K 3/0052; H05K 1/0306; H05K 2201/09027;
(Continued)

(56) References Cited

U.S. PATENT DOCUMENTS

| | | | | |
|---|---|---|---|---|
| 4,288,808 A | * | 9/1981 | Hantusch | H01L 24/80 257/738 |
| 7,394,189 B2 | * | 7/2008 | Kitagawa | H01J 5/62 313/318.1 |

(Continued)

FOREIGN PATENT DOCUMENTS

| | | |
|---|---|---|
| DE | 10 2010 043220 A1 | 5/2012 |
| JP | S52-014604 A | 2/1977 |

(Continued)

OTHER PUBLICATIONS

Japan Patent Office, Office Action (Notice of Reasons for Refusal) issued in corresponding Application No. JP 2018-244510, dated Jul. 5, 2022.

(Continued)

*Primary Examiner* — Steven T Sawyer
(74) *Attorney, Agent, or Firm* — Stites & Harbison, PLLC; Jeffrey A. Haeberlin; James R. Hayne

(57) ABSTRACT

A wiring substrate includes a substrate body composed of a plurality of ceramic layers (insulating materials) and having a front surface and a back surface located on opposite sides thereof and having a side surface located between the front surface and the back surface. The outline of the substrate body in a plan view which is a view from the front surface side is composed of a plurality of curved portions separated from one another and a plurality of straight portions each located between adjacent ones of the curved portions. The total length of the curved portions in the plan view is at least 40% of the sum of the total length of the curved portions and the total length of the straight portions.

7 Claims, 4 Drawing Sheets

(51) Int. Cl.
*H01L 21/48* (2006.01)
*H05K 3/00* (2006.01)

(58) Field of Classification Search
CPC ....... H05K 3/4629; H05K 2201/09063; H05K 2201/09145; H05K 2201/09018; H05K 2201/09172
See application file for complete search history.

(56) References Cited

U.S. PATENT DOCUMENTS

| | | | | |
|---|---|---|---|---|
| 2008/0101043 | A1* | 5/2008 | Westberg | G01D 11/24 29/729 |
| 2009/0197435 | A1* | 8/2009 | Jessup | H05K 3/366 439/876 |
| 2010/0053950 | A1 | 3/2010 | Higuchi et al. | |
| 2014/0218884 | A1* | 8/2014 | Sakai | H05K 1/183 361/762 |
| 2014/0254109 | A1* | 9/2014 | Lucas | F42C 19/06 361/749 |
| 2015/0159816 | A1 | 6/2015 | Preuschl et al. | |
| 2016/0109071 | A1 | 4/2016 | Chung | |
| 2019/0335580 | A1* | 10/2019 | Lin | H01R 12/714 |

FOREIGN PATENT DOCUMENTS

| | | |
|---|---|---|
| JP | H06-091628 A | 4/1994 |
| JP | 2001-068599 A | 3/2001 |
| JP | 2011-233687 A | 11/2011 |

OTHER PUBLICATIONS

European Patent Office, Partial European Search Report issued in corresponding Application No. 19219851.3, dated May 20, 2020.
Japan Patent Office, Office Action (Notice of Reasons for Refusal) issued in corresponding Application No. JP 2018-244510, dated Dec. 20, 2022.

* cited by examiner

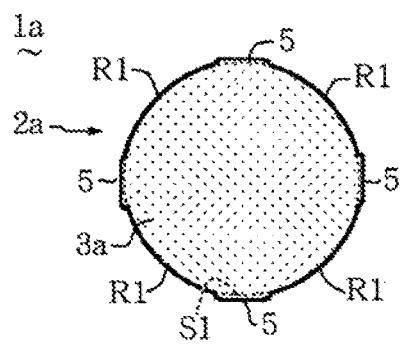 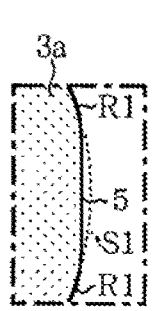 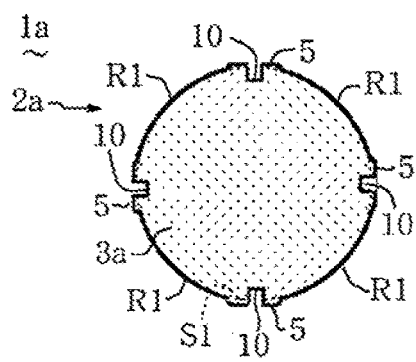
FIG. 3F     FIG. 3G     FIG. 3H
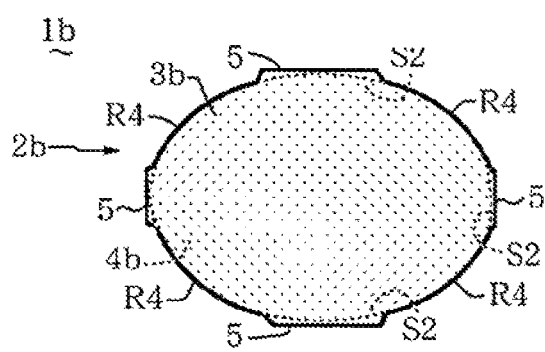 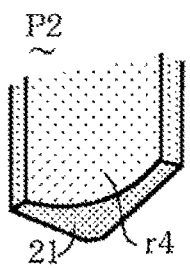 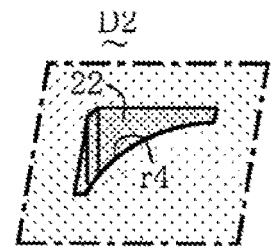
FIG. 4A     FIG. 4B     FIG. 4C
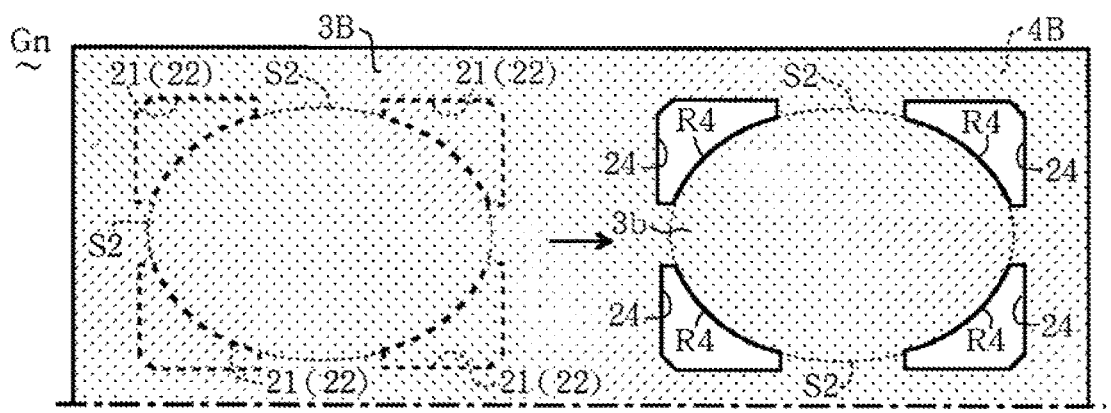
FIG. 4D

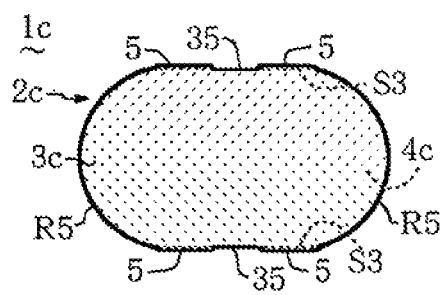
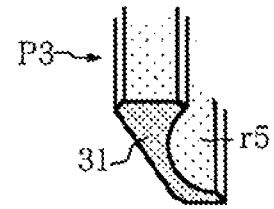
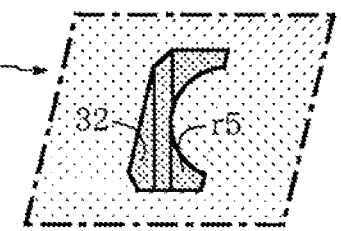
FIG. 5A   FIG. 5B   FIG. 5C
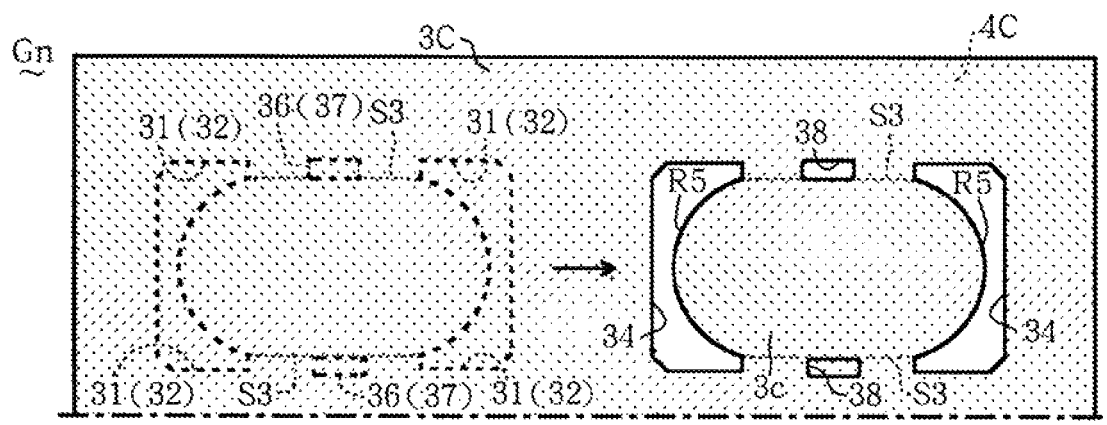
FIG. 5D

WIRING SUBSTRATE AND METHOD OF MANUFACTURING THE SAME

CROSS REFERENCE TO RELATED APPLICATION

The present application claims priority to Japanese Patent Application No. 2018-244510, which was filed on Dec. 27, 2018, the disclosure of which is hereby incorporated by reference in its entirety.

BACKGROUND OF THE INVENTION

Field of the Invention

The present invention relates to a wiring substrate whose outline, in plan view, has a particular shape, for example, a circular shape, and to a method of manufacturing the wiring substrate.

Description of Related Art

For example, in the case where a ceramic substrate body of a ceramic wiring substrate has a circular outline in plan view, in general, blanking is performed on a ceramic green sheet from which the above-mentioned substrate body will be obtained later. The blanking is performed through use of a circular columnar punch, and a die having a receiving hole for receiving a distal end portion of the punch. In the case where the center axis of the punch and the center axis of the die deviate from each other, it is difficult to blank out the substrate body from the ceramic green sheet such that the substrate body has a true circular shape in plan view. In addition, in the case where the distal end portion of the punch is deformed or broken, huge cost is needed for renewal of the punch. Therefore, there have been problems in terms of productivity and economy.

A ceramic substrate manufacturing method which solves the above-described problems has been proposed (see, for example, Patent Document 1). In the proposed method, a plurality of product regions having a circular outline in plan view are formed on an unfired green ceramic compact (mother substrate) such that the product regions are separated from one another; the green ceramic compact having the product regions is fired; subsequently, a resultant fired ceramic plate is divided into a plurality of pieces respectively including the plurality of product regions and respective throwaway regions surrounding the circumferences of the product regions and each having a polygonal (e.g., octagonal) outline in plan view; and the throwaway regions are successively ground from their peripheral sides by using a grinding stone such that disc-shaped ceramic substrates are formed.

However, the above-described ceramic substrate manufacturing method requires a complex cutting step of obtaining ceramic sintered bodies each composed of the above-mentioned product region and the throwaway region surrounding the circumference thereof, and a grinding step of subsequently pressing the throwaway region of each ceramic sintered body against the circumferential surface of a rotating grinding stone such that the outer periphery of the throwaway region comes into contact with the circumferential surface of a rotating grinding stone, thereby grinding the throwaway region. Therefore, the above-described ceramic substrate manufacturing method has the following problems. First, since the circularity in plan view is likely to vary among obtained ceramic substrates, stabilization of shape and dimensional accuracy is difficult. Second, since ceramic sintered bodies generally are high in hardness and excellent in wear resistance, the above-mentioned grinding step requires a very long time.

RELATED ART DOCUMENT

Patent Document 1 is Japanese Patent Application Laid-Open (kokai) No. 2001-68599 (pages 1 to 6 and FIGS. 1 to 7).

BRIEF SUMMARY OF THE INVENTION

The present invention has been accomplished so as to solve the problems described in the Background Art section. An object of the present invention is to provide a wiring substrate which is stable in shape and dimensional accuracy despite that its substrate body formed of an insulating material has a circular shape or the like shape in plan view. Another object of the present invention is to provide a manufacturing method which can quickly manufacture such a wiring substrate by a relatively small number of simple steps.

In order to solve the above-described problems, the present invention has been accomplished on the basis of the idea of defining a product outline in plan view of the substrate body formed of an insulating material by a plurality of curved portions separated from one another and a plurality of straight portions each located between adjacent ones of the curved portions, and specifying the total length of the curved portions.

Namely, a wiring substrate of the present invention comprises a substrate body formed of an insulating material and having a front surface and a back surface and having a side surface located between the front surface and the back surface, wherein, in a plan view which is a view from the front surface side, an outline of the substrate body includes a plurality of curved portions separated from one another and a plurality of straight portions each located between adjacent ones of the plurality of curved portions, and wherein, in the plan view, the total length of the plurality of curved portions is at least 40% of the sum of the total length of the plurality of curved portions and the total length of the plurality of straight portions.

Notably, the reason why the total length of the plurality of curved portions is specified to be at least 40% of the sum is to exclude substrate bodies having known shapes; for example, a substrate body which has a quadrangular (square or rectangular) outline in plan view and outwardly convex curved (radiused) portions at four corners.

The wiring substrate as described yields the following effects (1) and (2).

(1) Since the total length of the plurality of curved portions of the outline of the substrate body in plan view accounts for at least 40% of the sum of the total length of the plurality of curved portions and the total length of the plurality of straight portions, even when the wiring substrate has a substrate body whose shape in plan view is, for example, a true circular shape, an elliptical shape, or an elongated circular shape (i.e., a racetrack-like shape), which will be described later, the degree of freedom of design can be increased, and an error produced in its manufacturing process can be absorbed more easily. Therefore, it becomes possible to provide a wiring substrate which is high in accuracy and whose shape and dimensions are as close as possible to the desired shape and dimensions.

(2) Since straight portions remain as parts of the outline of the substrate body, it is possible to provide a wiring substrate which has, for example, a generally circular shape and whose direction and posture can be easily recognized.

Notably, the ratio of the total length of the plurality of curved portions to the sum of the total length of the plurality of curved portions and the total length of the plurality of straight portions is preferably 40% to 70%, more preferably, 60% to 65%. In the case where the above-described ratio falls in such a range, the wiring substrate can have sufficiently long curved portions while having straight portions.

Notably, the insulating material is a ceramic material (e.g., alumina) or a resin (e.g., epoxy resin).

The substrate body may be composed of a single insulating layer, or a plurality of insulating layers stacked together. The single insulating layer has appropriate connection conductors individually formed on each of the front and back surfaces, and via conductors extending through the insulating layer and establishing electrical continuity between the connection conductors on the front surface and the connection conductors on the back surface. In the case where the substrate body is composed of a plurality of insulating layers, additionally, inner layer wiring conductors are formed between the insulating layers.

The shape of the curved portions may be a curve defined by a single center and a single radius from the center (axis) or a curve (for example, a portion of an ellipse or a portion of a cycloid curve) defined by a plurality of centers and a plurality or radiuses from the centers (axes).

The substrate body may have an open cavity or open cavities formed on at least one of the front surface and the back surface, or an additional through hole(s) extending between the front surface and the back surface.

The present invention encompasses a wiring substrate in which, in the plan view, the plurality of curved portions correspond to a plurality of portions of an imaginary true circle, an imaginary ellipse, or an imaginary elongated circle which represents a product outline.

In this wiring substrate, the plurality of curved portions forming the outline of the substrate body in plan view form a plurality of portions of an imaginary true circle, an imaginary ellipse, or an imaginary elongated circle which are product outlines. Therefore, the wiring substrate has a substrate body having an outline which is identical with any of the product outlines or is very similar in shape to any of the product outlines. Accordingly, the above-described effect can be obtained actuality.

The present invention encompasses a wiring substrate in which, in the plan view, each straight portion is located outward in relation to ends of the curved portions located on opposite sides of the straight portion, the ends of the curved portions being located adjacent to the straight portion.

In this wiring substrate, in plan view, the substrate body contains the product outline without fail. Therefore, the above-described effect (1) can be obtained more reliably. In addition, after positioning the wiring substrate while holding the straight portions located outward of the curved portions or the boundaries between the straight portions and the curved portions, handling (e.g., transportation) of the wiring substrate can be performed easily, or positioning at the time of mounting an electronic component can be performed easily. Therefore, the above-described effect (2) can be obtained reliably.

Notably, in plan view, each straight portion may be located slightly inward of ends of the curved portions located on opposite sides of the straight portion, the ends being located adjacent to the straight portion.

The present invention encompasses a wiring substrate in which the substrate body is composed of a plurality of insulating layers stacked together, and at least one of the insulating layers has (defines) recesses which are formed at the straight portions and are open toward an outside of the straight portions in the plan view.

In this wiring substrate, since outwardly opening recesses are additionally formed at the straight portions, the following effect (3) can be obtained.

(3) Each of the straight portions has a recess which is open toward the outside with respect to the straight portion (reference). Therefore, when an electronic component is mounted on the front surface of the substrate body, positioning jigs can be fitted into the recesses. Also, it is possible to provide a wiring substrate in which a side surface conductor having a rectangular shape or a like shape in plan view is accurately disposed on a side surface of the substrate body such that the side surface conductor extends over a portion or the entirety (entire length) of the side surface in the thickness direction.

Notably, the recesses have, for example, a rectangular shape or a semi-circular shape in plan view, and is used for positioning when an electronic component such as a semiconductor device is mounted on the front surface of the substrate body or is used for formation of the above-mentioned side surface conductor.

A wiring substrate manufacturing method of the present invention is a method of manufacturing a wiring substrate comprising a substrate body formed of an insulating material and having a front surface and a back surface and having a side surface located between the front surface and the back surface, wherein an outline of the substrate body in a plan view which is a view from the front surface side is composed of a plurality of curved portions separated from one another and a plurality of straight portions each located between adjacent ones of the curved portions, and the total length of the curved portions in the plan view is at least 40% of the sum of the total length of the curved portions and the total length of the straight portions. The method comprises a blanking step of performing a blanking process on a mother substrate formed of an insulating material, having a front surface and a back surface, with an imaginary product outline set on the mother substrate, through use of a punch having a curved concave side surface corresponding to the curved portion corresponding to a portion of the product outline and a die having a receiving hole for receiving a distal end portion of the punch, thereby forming, on the outer side of the product outline of the mother substrate in the plan view, a plurality of through holes which are separated from one another and in which the curved portions are located along respective portions of the product outline; and a cutting step of cutting portions of the mother substrate which extend along the imaginary product outline and each of which is located between adjacent ones of the curved portions in the through holes separated from one another, thereby forming the straight portions.

The wiring substrate manufacturing method yields the following effects (4) and (5).

(4) In the blanking step, the plurality of curved portions of the outline of the substrate body in plan view can be formed through use of a punch having a concave curved surface for forming the curved portions and a die having a receiving hole having a convex curved surface similar in shape to the concave curved surface. In the cutting step, the mother substrate is cut, through use of a cutter rotating at high speed or a straight cutter which is pressed against the mother substrate so as to cut the mother substrate, along imaginary cutting lines each extending between adjacent ones of the curved portions. At a point in time immediately after formation of through holes for defining the curved portions, the substrate body is not separated from the mother substrate. After formation of the through holes, the cutting step is performed so as to cut the mother substrate along imaginary cutting lines extending along the straight portions of the substrate body, whereby the entire side surface of the substrate body can be formed accurately within a relatively short period of time. In addition, blanking is performed in each of divided regions extending along the curved portions of the imaginary product outline. Therefore, it is possible to decrease the stress acting on the mother substrate, thereby preventing unwanted deformation of the substrate body. Accordingly, it is possible to efficiently manufacture a wiring substrate having a substrate body excellent in the accuracy of shape and dimensions.

(5) Since the punch and the die have respective shapes corresponding to the divided curved portions of the product outline, the punch and the die are relatively small in size and can be manufactured easily at low cost. In addition, when the punch and/or the die wears, deforms, or breaks, the punch and/or the die can be repaired or replaced with a new one within a short period or time and at low cost. Therefore, facility cost and time and effort of facility management can be reduced, and maintenance work can be performed easily at low cost.

Notably, the above-described manufacturing method may be applied not only to the case of use of a mother substrate for manufacturing a large number of substrate bodies (i.e., a mother substrate having a plurality of product regions) but also to the case of use of a mother substrate having a single product region.

The present invention also encompasses a wiring substrate manufacturing method in which, in the blanking step, a plurality of the punches each having a curved concave side surface corresponding to the curved portion are disposed at positions which are point symmetrical with one another with respect to the center of the imaginary product outline in the plan view.

In this method, the above-described blanking step can be performed through use of the four punches point-symmetrically attached to the bottom surface of a slide which is moved vertically and the four dies symmetrically attached to the top surface of a base. Therefore, the plurality of curved portions can be formed accurately by performing the blanking step within a shorter period of time. Accordingly, the above-described effect (4) can be obtained more remarkably.

The present invention further encompasses a wiring substrate manufacturing method in which, in the cutting step, cutting is performed by inserting a cutter having a straight cutting edge into the portions of the mother substrate which extend along the imaginary product outline and each of which is located between adjacent ones of the curved portions in the through holes, wherein, before formation of the straight portions, a blanking process is previously performed on at least one of a plurality of insulating layers constituting the mother substrate, through use of a punch and a die different from the punch and the die used for formation of the through holes, such that the blanking process is performed in regions intersecting with the straight portions in the plan view. In other words, the mother substrate is composed of a plurality of insulating layers, and before formation of the straight portions, a second blanking process is performed on at least one of a plurality of insulating layers, through use of a second punch and a second die different from the punch and the die used for formation of the through holes, the second blanking process performed in regions intersecting with the straight portions in the plan view.

This wiring substrate manufacturing method yields the following effect (6).

(6) In the blanking step, after formation of the through holes forming the curved portions through blanking or simultaneously with formation of the through holes through blanking, a blanking process different from the blanking process for forming the curved portions is further performed, through use of a punch having, for example, a rectangular or circular distal end surface and a die having a receiving hole for receiving a distal end portion of the punch, in each of regions intersecting with straight portions each of which is formed later between adjacent ones of the through holes. Accordingly, it is possible to easily, quickly, and accurately form the above-mentioned recesses at desired positions while using the straight portions as references.

BRIEF DESCRIPTION OF THE DRAWINGS

Illustrative aspects of the invention will be described in detail with reference to the following figures wherein:

FIG. 3F is a plan view of the wiring substrate of FIG. 3A after a cutting step.

FIG. 3G is a partial enlarged view showing a straight portion of a modification of the wiring substrate.

FIG. 3H is a plan view of the wiring substrate of FIG. 3B after the cutting step.

FIG. 4A is a plan view of a wiring substrate according to a second embodiment of the present invention.

FIGS. 4B and 4C are perspective views showing a punch and a die used in the blanking step.

FIG. 4D is a partial schematic view showing the blanking step for obtaining the wiring substrate of FIG. 4A.

FIG. 5A is a plan view of a wiring substrate according to a third embodiment of the present invention.

FIGS. 5B and 5C are perspective views showing a punch and a die used in the blanking step.

FIG. 5D is a partial schematic view showing the blanking step for obtaining the wiring substrate of FIG. 5A.

DETAILED DESCRIPTION OF EXEMPLARY EMBODIMENTS OF THE INVENTION

Embodiments of the present invention will now be described.

Figure 1A:
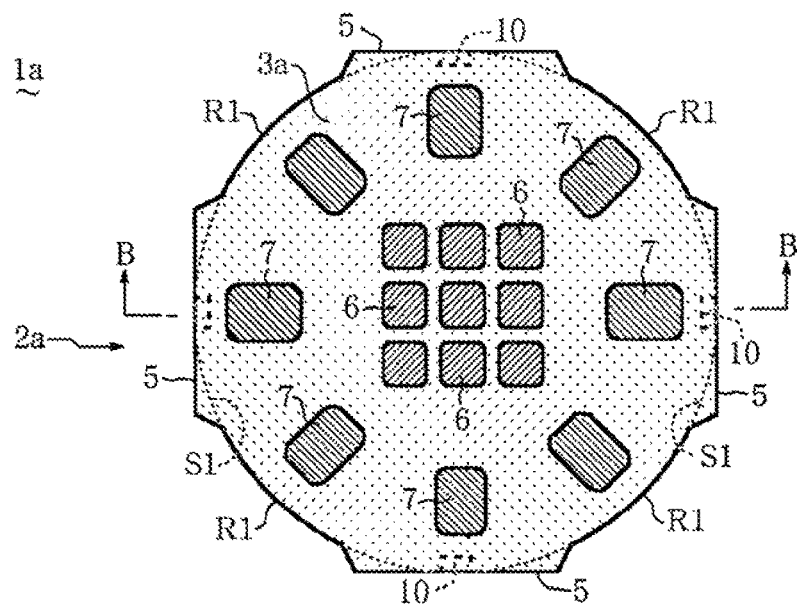
FIG. 1A is a plan view of a wiring substrate according to a first embodiment of the present invention.
Figure 1B:
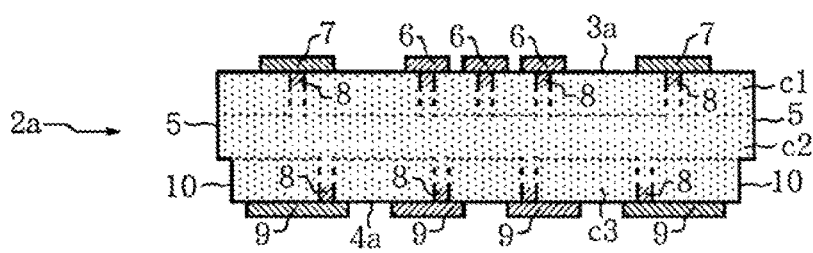
FIG. 1B is a vertical sectional view of the wiring substrate taken along line B-B in FIG. 1A.

FIG. 1A is a plan view of a wiring substrate $1a$ according to a first embodiment of the present invention, and FIG. 1B is a vertical sectional view of the wiring substrate $1a$ taken along line B-B in FIG. 1A.

As shown in FIGS. 1A and 1B, the wiring substrate $1a$ includes a substrate body $2a$ composed of a plurality of ceramic (insulating material) layers $c1$ to $c3$ stacked together. The substrate body $2a$ has a front surface $3a$ and a back surface 4a located on opposite sides thereof, and has a side surface located between the front surface 3a and the back surface 4a. The outline of the substrate body 2a in plan view from the front surface 3a side has four (a plurality of) curved portions R1 and four (a plurality of) straight portions 5. The curved portions R1 are separated from one another, and each of the straight portions 5 is located between two adjacent ones of the curved portions R1.

The ceramic layers c1 to c3 are formed mainly of, for example, alumina.

As shown in FIG. 1A, the four curved portions R1 constitute a plurality of portions of an imaginary true circle S1 which is an imaginary product outline of the front surface 3a and are disposed at positions which are point symmetry with one another with respect to the center of the true circle S1.

In plan view, each straight portion 5 located between two adjacent ones of the curved portions R1 is located outward of end portions of the curved portions R1 on the opposite sides of the straight portion 5, the end portions being located adjacent to the straight portion 5, and a portion of the true circle S1 is tangent to a longitudinal central portion of the straight portion 5. The four straight portions 5 are also disposed at positions which are point symmetry with one another with respect to the center of the true circle S1.

In the plan view shown in FIG. 1A, the total length of the four curved portions R1 accounts for about 50% (40% or more) of the sum of the total length of the four curved portions R1 and the total length of the four straight portions 5.

As shown in FIG. 1A, a plurality of electrode pads 6 and a plurality of electrode pads 7 are formed on the front surface 3a of the substrate body 2a. The electrode pads 6 are disposed in a lattice pattern in a central region of the front surface 3a. The electrode pads 7 are disposed in a ring-shaped pattern at approximately equal intervals along the periphery of the front surface 3a; i.e., along the imaginary true circle S1.

As shown in FIG. 1B, a plurality of external connection terminals 9 are formed on the back surface 4a of the substrate body 2a. The external connection terminals 9 are electrically connected to the electrode pads 6 and 7 formed on the front surface 3a through via conductors 8 penetrating the ceramic layers c1 to c3 at predetermined positions and a plurality of unillustrated inner layer wiring conductors formed between the ceramic layers c1 to c3.

Notably, the electrode pads 6 and 7, the via conductors 8, the external connection terminals 9, and the inner layer wiring conductors are formed mainly of tungsten (W) or molybdenum (Mo).

As shown in FIGS. 1A and 1B, the lowermost ceramic layer c3 has recesses 10 which are formed approximately at the longitudinal centers of the straight portions 5 and which have a rectangular shape in plan view and are open outward. When an electronic component (not shown) such as a semiconductor device is mounted on the electrode pads 6 and 7, the recesses 10 are utilized; i.e., jigs (not shown) for positioning the substrate body 2a are fitted into the recesses 10.

Notably, the recesses 10 may be formed along the entire length of the substrate body 2a in the thickness direction thereof; i.e., between the front surface 3a and the back surface 4a.

The plan view of the back surface 4a of the substrate body 2a is the same as that of the front surface 3a except that the back surface 4a has the recesses 10.

Figures 2A, 2B:
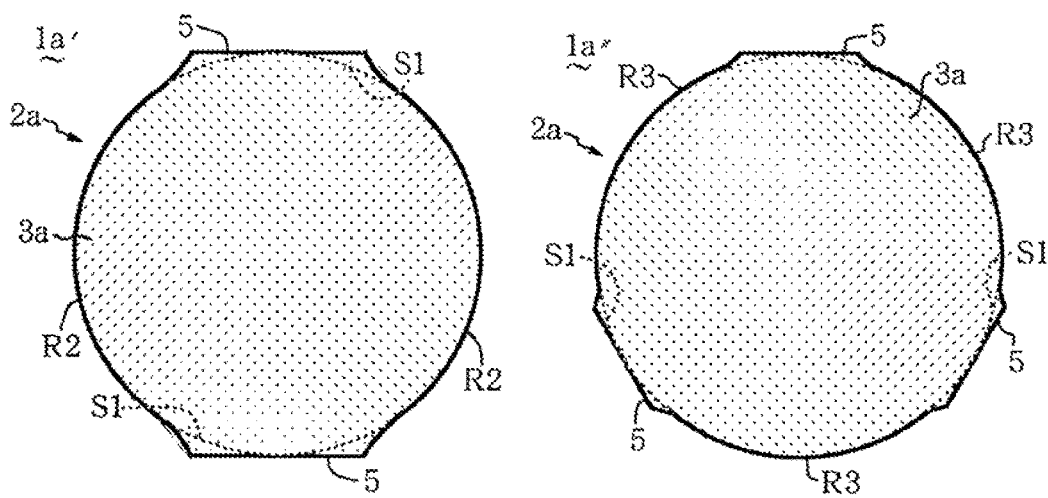
FIG. 2A and FIG. 2B are plan views each showing a modification of the wiring substrate.

FIGS. 2A and 2B are plan views showing a wiring substrate 1a' and a wiring substrate 1a" which are modifications of the wiring substrate 1a. The electrode pads 6 and 7 are not illustrated in these drawings.

As shown in FIG. 2A, in the view from the front surface 3a side of the substrate body 2a, the outline of the wiring substrate 1a' has two curved portions R2 as portions of the imaginary true circle S1 and two straight portions 5 located between the curved portions R2. As shown in FIG. 2B, in the view from the front surface 3a side of the substrate body 2a, the outline of the wiring substrate 1a" has three curved portions R3 as portions of the imaginary true circle S1 and three straight portions 5 each located between adjacent ones of the curved portions R3.

Notably, the total length of the two curved portions R2 of the wiring substrate 1a' accounts for about 60% (40% or more) of the sum of the total length of the two curved portions R2 and the total length of the two straight portions 5.

Also, the total length of the three curved portions R3 of the wiring substrate 1a" accounts for about 70% (40% or more) of the sum of the total length of the three curved portions R3 and the total length of the three straight portions 5.

Moreover, the recesses 10 may be formed at the straight portions 5 of the wiring substrates 1a' and 1a" in a manner similar to the above-described manner.

In the above-described wiring substrate 1a (including the wiring substrates 1a' and 1a"), the total length of the curved portions R1 to R3 of the outline of the substrate body 2a in plan view accounts for at least 40% of the sum of the total length of the curved portions R1 to R3 and the total length of the straight portions 5. Therefore, for example, even when the outline of the substrate body 2a in plan view is rendered similar to a circular shape, the degree of freedom of design can be increased, and an error produced in its manufacturing process can be absorbed more easily. Therefore, it is possible to provide the wiring substrate 1a which is high in accuracy and whose shape and dimensions are as close as possible to the shape and dimensions of the required true circle S1. Also, since the straight portions 5 remain as parts of the outline of the substrate body 2a, it is possible to obtain the generally circular wiring substrate 1a whose direction and posture can be easily recognized.

Further, each of the straight portions 5 has the recess 10 which is open toward the outside with respect to the straight portion 5 (reference). Therefore, when an electronic component is mounted on the front surface 3a of the substrate body 2a, positioning jigs can be fitted into the recesses 10. Also, a side surface conductor having a concave shape or a like shape in plan view can be accurately disposed on a side surface of the substrate body 2a such that the side surface conductor extends over a portion or the entirety (entire length) of the side surface in the thickness direction.

Accordingly, the wiring substrate 1a can yield the above-described effects (1) to (3) without fail.

A method of manufacturing the wiring substrate 1a will now be described with reference to FIGS. 3A to 3H.

Figure 3A:
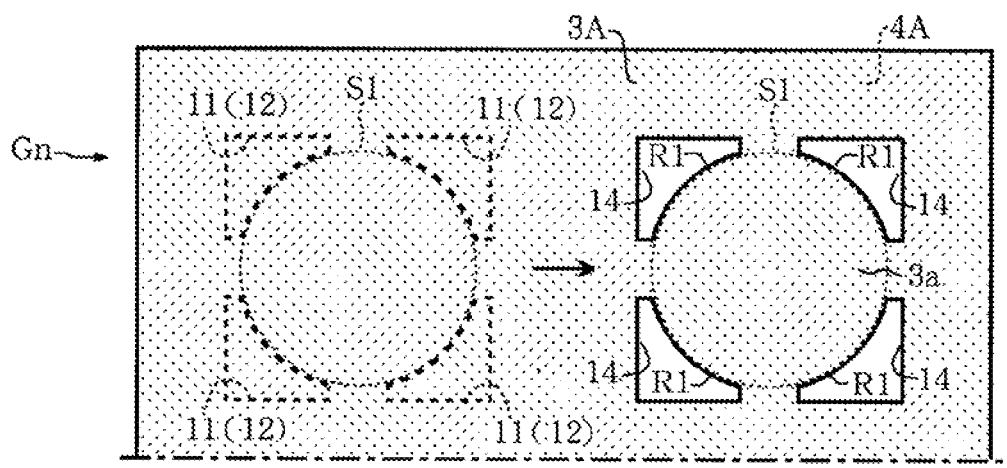
FIG. 3A is a partial schematic view showing a blanking step for obtaining the wiring substrate of FIG. 1A.

A ceramic slurry was prepared beforehand by mixing alumina powder, a binder resin, a solvent, a plasticizer, etc., in respective proper amounts. The ceramic slurry was then formed into a sheet shape by a doctor blade method. Thus, a mother substrate Gn (a ceramic green sheet for multiple pieces) was manufactured. As shown in FIG. 3A, the mother substrate Gn had a front surface 3A and a back surface 4A located on opposite sides thereof. Notably, the mother substrate Gn may be formed of three green sheets stacked together or a single green sheet. Such a mother substrate Gn continuously extends in the vertical direction toward the lower side of FIG. 3A (this holds true in the following description).

Green (unfired) conductive layers which were to become the electrode pads 6 and 7, the via conductors 8, the external connection terminals 9, and the inner layer wiring conductors, respectively, were formed beforehand on the green sheet at predetermined positions.

First, as shown on the left side of FIG. 3A, an imaginary true circle (imaginary product outline) S1 was set on the mother substrate Gn at each of predetermined positions. Subsequently, a blanking step for forming the curved portions R1 was performed at four positions which were located on the outer side of the true circle S1 and along the true circle S1 and were point symmetry with one another with respect to the center of the true circle S1.

Figure 3B:
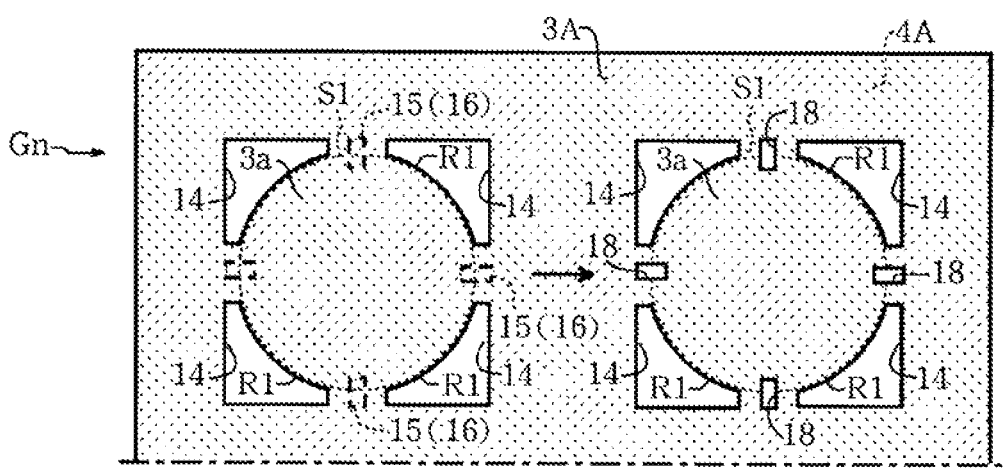
FIG. 3B is a partial schematic view showing a blanking step for obtaining a modification of the wiring substrate.
Figure 3C:
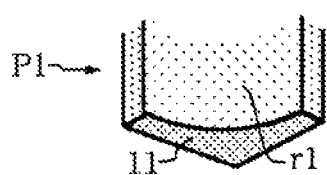
FIGS. 3C to 3E are perspective views showing punches and dies used in these steps.
Figure 3D:
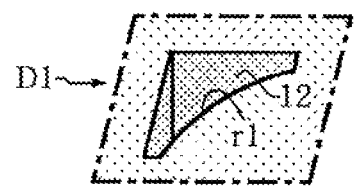

The blanking step was performed by using a punch P1 and a die D1 shown in FIGS. 3C and 3D, respectively. The punch P1 has a distal end surface 11 including a concave curved surface r1 similar in shape to the curved portion R1. The die D1 has a receiving hole 12 which receives a distal end portion of the punch P1 and which includes a convex curved surface r1 similar in shape to the curved portion R1.

Namely, as exemplified on the left side of FIG. 3A, at each of the four positions along the outer side of the true circle S1 set on the mother substrate Gn, the die D1 was disposed on the back surface 4A side of the mother substrate Gn. Subsequently, the punch P1 was moved downward on the front surface 3A side of the mother substrate Gn such that the distal end portion of the punch P1 penetrated the mother substrate Gn and entered the receiving hole 12 of the die D1. Notably, this blanking process may be performed simultaneously at the above-described four positions or performed sequentially position by position.

Notably, in consideration of the stress acting on the mother substrate Gn during the blanking process, it is more preferred that the blanking process for forming the curved portions R1 be performed sequentially position by position.

As a result, as exemplified on the right side of FIG. 3A, four through holes 14 which were similar in shape to the distal end surface 11 of the punch P1 and the receiving hole 12 of the die D1 were formed at positions which were located along the true circle S1 set on the mother substrate Gn and were point symmetry with one another with respect to the center of the true circle S1. A portion of the inner wall surface of each through hole 14 located on the true circle S1 side defines a corresponding one of the curved portions R1. The blanking step as described above was performed at each of the locations of the plurality of true circles S1 set on the mother substrate Gn.

Further, the mother substrate Gn was fired, and a cutting step was then performed. In the cutting step, as exemplified on the right side of FIG. 3A, a disc-shaped cutter (not shown) rotating at high speed was caused to pass along each of imaginary cutting lines located on the outer side of the true circle S1 and each extending between two curved portions R1 located in two adjacent ones of the through holes 14.

As a result, the above-described wiring substrate 1a was obtained. In the obtained wiring substrate 1a, as shown by the plan view of FIG. 3F, the outline of the substrate body 2a is formed by the four curved portions R1 which are point symmetry with one another with respect to the center of the imaginary true circle S1 and the four straight portions 5 each of which is located between two adjacent ones of the curved portions R1 and which are located on the outer side of the true circle S1 to be point symmetry with one another with respect to the center of the imaginary true circle S1.

Notably, in the cutting step, the above-mentioned cutter may be caused to pass along each of imaginary cutting lines located slightly inward of the true circle S1 and each extending between two curved portions R1 located in two adjacent ones of the through holes 14. As a result, as shown by the partial enlarged view of FIG. 3G, the straight portions 5 are formed to be located slightly inward of the true circle S1.

Even a wiring substrate having the above-described configuration can be handled in the same manner as the wiring substrate 1a so long as the above-described configuration does not cause a problem in disposing the electrode pads 6 and 7 on the front surface 3a of the substrate body 2a and the external connection terminals 9 on the back surface 4a of the substrate body 2a.

Figure 3E:
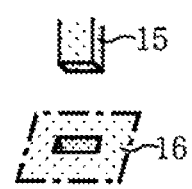

Also, in the blanking step, after formation of the desired number of through holes 14 in the mother substrate Gn, as exemplified on the left side of FIG. 3B, a blanking process may be performed, at each midpoint between two adjacent ones of the through holes 14, through use of a punch 15 and a die 16. As shown by FIG. 3E, the punch 15 has a rectangular parallelepiped shape as a whole and has a rectangular (quadrangular) distal end surface, and the die 16 has a receiving hole for receiving a distal end portion of the punch 15.

As a result, as shown on the right side of FIG. 3B, rectangular through holes 18 were individually formed at a position near the midpoint between two adjacent ones of the through holes 14. The through hole 18 extends in the radial direction of the true circle S1 and intersects with the true circle S1.

Subsequently, the same cutting step as described above was performed on the mother substrate Gn having the four through holes 14 and the four through holes 18. As a result, as shown by the plan view of FIG. 3H, a modified wiring substrate 1a having the recesses 10 formed near the midpoints of the four straight portions 5 to be open outward was obtained.

In the above-described method of manufacturing the wiring substrate 1a, all the side surfaces of the substrate body 2a were formed accurately within a relatively short time by the above-described blanking step and the above-described cutting step. Specifically, in the blanking step, the plurality of curved portions R1 of the substrate body 2a (serving to form the outline in plan view) were formed by using the punch P1 having the concave curved surface r1 for forming the curved portion R1 and the die D1 having the receiving hole 12 including the convex curved surface r1 similar in shape to the above-mentioned concave curved surface r1. At the time immediately after the formation of the through holes 14 defining the curved portion R1, the substrate body 2a had not yet been separated from the mother substrate Gn. After the formation of the through holes 14, in the cutting step, through use of the above-mentioned cutter, the mother substrate Gn was cut along imaginary cutting lines each located between two adjacent ones of the curved portions R1; i.e., along portions of the mother substrate Gn becoming the straight portions 5 of the substrate body 2a. As a result, all the side surfaces of the substrate body 2a was formed accurately within a relatively short time. In addition, blanking was performed in each of divided regions extending along portions of the imaginary product outline S1 corresponding to the curved portions R1, it was possible to decrease the stress acting on the mother substrate Gn, thereby preventing unwanted deformation of the substrate body 2a. Accordingly, it was possible to efficiently manufacture the wiring substrate 1a having the substrate body 2a excellent in the accuracy of shape and dimensions.

The punch P1 and the die D1 have the concave curved surface r1 and the convex curved surface r1, respectively, which correspond to the curved portion R1. Therefore, the punch P1 and the die D1 are relatively small in size and can be manufacture easily at low cost. In addition, when the punch P1 and/or the die D1 wears, deforms, or breaks, the punch P1 and/or the die D1 can be repaired or replaced with a new one within a short period or time and at low cost. Therefore, facility cost and time and effort of facility management can be reduced, and maintenance work can be performed easily at low cost.

Further, it was possible to easily and quickly perform the step of forming the recesses 10 as a part of the blanking step, and it was possible to accurately form the recesses 10.

Accordingly, the above-mentioned method of manufacturing the wiring substrate 1a yielded the above-described effects (4) to (6) without fail.

Notably, the wiring substrate 1a shown in FIG. 3H may be configured such that the four straight portions 5 are formed to be located slightly inward of the true circle S1 as exemplified by FIG. 3G, and the recesses 10 which are open outward are formed near the midpoints of the straight portions 5.

The above-described wiring substrate 1a" can be manufactured by performing a blanking process by using three sets of punches and dies whose dimensions are appropriately increased from those of the punch P1 and the die D1, and then performing a firing step and a cutting step similar to the above-described firing step and the above-described cutting step.

Similarly, the above-described wiring substrate 1a' can be manufactured by performing a blanking process by using two sets of punches and dies, and then performing a firing step and a cutting step similar to the above-described firing step and the above-described cutting step. Each of the punches used in this case has on its distal end surface a concave curved surface r2 corresponding to the curved portion R2, and each of the dies used in this case has a receiving hole for receiving a distal end portion of the corresponding punch.

FIG. 4A is a plan view showing a wiring substrate 1b according to a second embodiment of the present invention. FIGS. 4B and 4C are perspective views showing a punch P2 and a die D2 used in a blanking step for manufacture of the wiring substrate 1b. FIG. 4D is a partial schematic view showing the blanking step for obtaining the wiring substrate 1b of FIG. 4A. Notably, in FIG. 4A, the above-described electrode pads 6 and 7 are not illustrated.

The wiring substrate 1b includes a substrate body 2b composed of a plurality of ceramic layers c1 to c3 which are similar to the above-described ceramic layers c1 to c3 and stacked together or a single ceramic layer. As shown FIG. 4A, the substrate body 2b has an elliptical front surface 3b and an elliptical back surface 4b located on opposite sides thereof, and a side surface located between the circumferences of the front surface 3b and the back surface 4b. The side surface is composed of four curved portions R4 and four straight portions 5. In plan view, the curved portions R4 are disposed at positions which are point symmetry with one another with respect to the center of the front surface 3b, each straight portion 5 is located between two adjacent ones of the curved portions R4, and the four straight portions 5 are also disposed at positions which are point symmetry with one another with respect to the center of the front surface 3b.

As shown in FIG. 4A, all the four straight portions 5 are located on the outer side of an imaginary ellipse (an imaginary product outline) S2.

For obtaining the wiring substrate 1b, as shown in FIG. 4D, a mother substrate Gn which is similar to the above-described mother substrate and which has a front surface 3B and a back surface 4B on the opposite sides thereof is prepared beforehand. Subsequently, as exemplified on the left side of FIG. 4D, a blanking process is performed, through use of a punch P2 and a die D2 which will be described below, at each of positions along an imaginary ellipse (imaginary product outline) S2 previously set at each of predetermined positions. The positions along the imaginary ellipse S2 are point symmetry with one another with respect to the center of symmetry. The punch P2 has a concave curved surface r4 which is located on the ellipse S2 side and is similar in shape to the curved portion R4. The die D2 has a convex curved surface r4 which is located on the ellipse S2 side and is similar in shape to the curved portion R4.

As shown in FIG. 4B, the punch P2 has a distal end surface 21 having two straight sides (specifically, a long straight side and a short straight side) and a curved side located between the two straight sides and corresponding to the concave curved surface r4 which is similar in shape to the curved portion R4. As shown in FIG. 4C, the die D2 has a receiving hole 22 which is similar in shape to the distal end surface 21 and which includes, as a portion of its inner wall surface, a convex curved surface r4 which is similar in shape to the curved portion R4.

In the blanking step for obtaining the wiring substrate 1b, as exemplified on the left side of FIG. 4D, at each of the four positions along the ellipse S2 set on the mother substrate Gn, the die D2 is disposed on the back surface 4B side of the mother substrate Gn. Subsequently, the punch P2 is moved downward on the front surface 3B side of the mother substrate Gn such that the distal end portion of the punch P2 penetrates the mother substrate Gn and enters the receiving hole 22 of the die D2. Notably, this blanking process may be performed simultaneously at the above-described four positions or performed sequentially position by position. Notably, in consideration of the stress acting on the mother substrate Gn during the blanking process, it is preferred that the blanking process for forming the curved portions R4 be performed sequentially position by position.

As a result, as exemplified on the right side of FIG. 4D, four through holes 24 which are similar in shape to the distal end surface 21 of the punch P2 and the receiving hole 22 of the die D2 are formed at positions which are located along the ellipse S2 set on the mother substrate Gn and are point symmetry with one another with respect to the center of symmetry within the ellipse S2. A portion of the inner wall surface of each through hole 24 located on the ellipse S2 side contains a corresponding one of the curved portions R4. The blanking step as described above is performed for each of the plurality of ellipses S2 set on the mother substrate Gn.

Further, the mother substrate Gn having the four through holes 24 formed at desired positions along each ellipse S2 is fired, and a cutting step similar to the above-described cutting step is then performed along each of imaginary cutting lines located on the outer side of the ellipse S2 and each extending between two curved portions R4 located in two adjacent ones of the through holes 24.

Notably, the above-described cutting process may be performed along each of imaginary cutting lines located slightly inward of the ellipse S2 and each extending between two curved portions R4 located in two adjacent ones of the through holes 24. As a result, exemplified by FIG. 3G, the straight portions 5 are formed to be located slightly inward of the ellipse S2.

Also, the above-described recess 10 may be formed for some or all of the straight portions 5.

FIG. 5A is a plan view showing a wiring substrate 1c according to a third embodiment of the present invention. FIGS. 5B and 5C are perspective views showing a punch P3 and a die D3 used in a blanking step for manufacture of the wiring substrate 1c. FIG. 5D is a partial schematic view showing the blanking step for obtaining the wiring substrate 1c. Notably, in FIG. 5A, the above-described electrode pads 6 and 7 are not illustrated.

The wiring substrate 1c includes a substrate body 2c composed of a plurality of ceramic layers c1 to c3 which are similar to the above-described ceramic layers c1 to c3 and stacked together or a single ceramic layer. As shown FIG. 5A, the substrate body 2c has an elongated-circular front surface 3c and an elongated-circular back surface 4c located on opposite sides thereof, and a side surface located between the circumferences of the front surface 3c and the back surface 4c. The side surface is composed of two (left and right) curved portions R5, four straight portions 5, and two (upper and lower) shallow concave portions 35. In plan view, the curved portions R5 are disposed at positions which are point symmetry with one another with respect to the center of symmetry of the front surface 3c, the four straight portions 5 are disposed between the two curved portions R5 to be point symmetry with one another with respect to the center of symmetry. One of the concave portions 35 is located between the upper straight portions 5, and the other concave portion 35 is located between the lower straight portions 5. Notably, as shown in FIG. 5A, each of the four straight portions 5 is located on an imaginary elongated circle (an imaginary product outline) S3.

For obtaining the wiring substrate 1c, as shown in FIG. 5D, a mother substrate Gn which is similar to the above-described mother substrate and which has a front surface 3C and a back surface 4C on the opposite sides thereof is prepared beforehand. Subsequently, as exemplified on the left side of FIG. 5D, a blanking process is performed, through use of a punch P3 and a die D3 which will be described below, at each of positions along an imaginary elongated circle (imaginary product outline) S3 previously set at each of predetermined positions. The positions along the imaginary ellipse S3 are point symmetry with one another with respect to the center of symmetry of the imaginary elongated circle S3. The punch P3 has a concave curved surface r5 which is similar in shape to the curved portion R5 and extends from its distal end surface. The die D3 has a convex curved surface r5 which is similar in shape to the curved portion R5 and extends from its distal end surface.

As shown in FIG. 5B, the punch P2 has a distal end surface 31 having three straight sides (specifically, one long straight side and two short straight sides) and a curved side located between the two short straight sides and corresponding to the concave curved surface r5 which is similar in shape to the curved portion R5. As shown in FIG. 5B, the die D3 has a receiving hole 32 which is similar in shape to the distal end surface 31 and which includes, as a portion of its inner wall surface, a convex curved surface r5 which is similar in shape to the curved portion R5. Furthermore, a punch 36 which has a rectangular distal end surface as in the case of the above-described punch 15 and a die 36 which has a rectangular receiving hole as in the case of the above-described die 16 are prepared separately.

In the blanking step for obtaining the wiring substrate 1c, as exemplified on the left side of FIG. 5D, at each of the two (left and right) positions along the elongated circle S3 set on the mother substrate Gn, the die D3 is disposed on the back surface 4C side of the mother substrate Gn. Subsequently, the punch P3 is moved downward on the front surface 3B side of the mother substrate Gn such that the distal end portion of the punch P3 penetrates the mother substrate Gn and enters the receiving hole 32 of the die D3. Notably, this blanking process may be performed simultaneously at the above-described two positions or performed sequentially position by position. Notably, in consideration of the stress acting on the mother substrate Gn during the blanking process, it is preferred that the blanking process for forming the curved portions R5 be performed sequentially position by position.

As a result, as exemplified on the right side of FIG. 5D, two through holes 34 which are similar in shape to the distal end surface 31 of the punch P3 and the receiving hole 32 of the die D3 are formed at positions which are located along the elongated circle S3 set on the mother substrate Gn and are point symmetry with one another with respect to the center of symmetry within the elongated circle S3. A portion of the inner wall surface of each through hole 34 located on the elongated circle S3 side includes a corresponding one of the curved portions R5. The blanking step as described above is performed for each of the plurality of elongated circles S3 set on the mother substrate Gn.

Subsequently, at each of points which are located on the upper and lower sides, respectively of the elongated circle S3 and are located near the midpoint between the two through holes 34, a blanking process different from the above-described blanking process is performed through use of the punch 36 and the die 37 which are oriented such that their long sides extend along the above-mentioned upper and lower sides. As a result, as exemplified on the right side of FIG. 5D, a through hole 38 having a rectangular shape in plan view is formed at each of the above-described positions. Notably, as exemplified on the right side of FIG. 5D, the inner-side long sides of the through holes 38 may coincide with the upper and lower sides of the elongated circle S3.

Further, after the above-described blanking step, the mother substrate Gn having the two through holes 34 and the two through holes 38 formed at desired positions along each elongated circle S3 is fired, and a cutting step similar to the above-described cutting step is then performed along each of imaginary cutting lines located on the outer side of the elongated circle S3 and extending between the curved portions R5 located in the two through holes 34.

Notably, the above-described cutting process may be performed along each of imaginary cutting lines located slightly inward of the elongated circle S3 and extending between the two curved portions R5. As a result, as exemplified by FIG. 3G, the straight portions 5 are formed to be located slightly inward of the elongated circle S3.

Even in such a case, the above-described recess 10 may be formed for some or all of the straight portions 5.

The above-described wiring substrate 1b may have a substrate body 2b having two (left and right) semi-elliptical curved portions as in the case of the above-described wiring substrate 1c. In a method of manufacturing the substrate body 2b, a punch and a die similar to the punch P3 and the die D3 may be used.

As in the case of the above-described wiring substrate 1b, the above-described wiring substrate 1c may have a substrate body 2c having four curved portions which are point symmetric with one another. In a method of manufacturing the substrate body 2c, a punch and a die similar to the punch P2 and the die D2 may be used.

Even such wiring substrates 1b and 1c yield the above-described effects (1) to (3), and the methods of manufacturing the wiring substrates 1b and 1c yield the above-described effects (4) to (6).

The present invention is not limited to the above-described embodiments.

For example, ceramic materials other than the above-mentioned alumina (e.g., mullite, aluminum nitride, and glass-ceramic) and resins (e.g., epoxy resin) may be used as an insulating material for forming the substrate bodies 2a to 2c. In the case where the glass-ceramic or resin is used, copper or silver is used for the conductors such as the electrode pads 6 and 7.

Each of the above-mentioned substrate bodies may be a composite body composed a ceramic insulating layer(s) and a resin insulating layer(s) stacked together.

Each of the above-mentioned substrate bodies 2a to 2c may have an open cavity or open cavities formed on at least one of the front surface 3a to 3c and the back surface 4a to 4c or an additional through hole(s) extending between the front surface and the back surface.

No particular limitation is imposed on the outline (product shape) of each substrate body in plan view so long as the outline is composed of three or more curved portions and three or more straight portions located therebetween, and the total length of the curved portions accounts for at least 40% of the overall length of the side surface of the substrate body as measured in the planar direction thereof. For example, in plan view, the entirety of each substrate body may have a square or rectangular shape, or may have the shape of a regular polygon having five or more corners or a modified polygonal shape. Alternatively, in plan view, the entirety of each substrate body may have a cruciform shape or a star shape.

In the above-described embodiments, the cutting step is performed after firing of the mother substrate Gn. However, the cutting step may be performed before firing of the mother substrate Gn. In this case, in the cutting step, a cutter (not shown) having a straight cutting edge is inserted into the mother substrate Gn before being fired, at each of the above-described positions between the curved portions R1, R4, or R5 located in adjacent ones of the through holes 14, 24, or 34. Thus, pieces which are to become wiring substrates are obtained, and the pieces are then fired.

In the cutting step, through use of a straight cutter having a straight cutting edge, a plurality of straight portions extending in the same direction may be formed simultaneously over a region including the plurality of product outlines set on the mother substrate.

The above-described recesses may have a semi-circular shape, a semi-elongated circular shape, or a semi-elliptical shape in plan view.

Each of the recesses may be formed such that it is open outward at an arbitrary position of each curved portion.

Each of the wiring substrate 1a, 1a', 1a", 1b, and 1c may be a multilayer wiring substrate including two or more ceramic layers.

In the case where the wiring substrate 1a, 1a', 1a", 1b, or 1c has a substrate body composed of two or more ceramic layers stacked together, in the above-described blanking step, blanking is performed, sheet by sheet, for a plurality of green sheets which are to become the plurality of ceramic layers. Subsequently, the plurality of green sheets having through holes formed therein are stacked and fired. In this case, as compared with the case where the blanking step is performed after stacking of the plurality of green sheets, the stress acting on the mother substrate Gn during the blanking can be reduced because the thickness of each green sheet is small. In such a case, the above-described cutting step may be performed before the plurality of stacked green sheets are fired.

The present invention makes it possible to provide a wiring substrate which is stable in shape and dimensional accuracy despite that its substrate body formed of an insulating material has a circular shape or the like shape in plan view and a manufacturing method which can reliably manufacture such a wiring substrate by a relatively small number of simple steps.

DESCRIPTION OF REFERENCE NUMERALS AND SYMBOLS 1a to 1c: wiring substrate
2a to 2c: substrate body
3a to 3c: front surface of substrate body
3A to 3C: front surface of mother substrate
4a to 4c: back surface of substrate body
4A to 4C: back surface of mother substrate
5: straight portion
10: recess
12, 22, 32: receiving hole
14, 24, 34: through hole
15, P1 to P3: punch
16, D1 to D3: die
R1 to R5: curved portion
S1 to S3: imaginary product outline
c1 to c3: ceramic layer (insulating layer)
Gn: mother substrate

What is claimed is:

1. A wiring substrate comprising a substrate body formed of an insulating material, the substrate body having a front surface, a back surface, and a side surface located between the front surface and the back surface,
   wherein, in a plan view which is a view from the front surface, an outline of the substrate body includes a plurality of curved portions separated from one another and a plurality of straight portions each located between adjacent ones of the plurality of curved portions,
   wherein, in the plan view, a total length of the plurality of curved portions is at least 40% of a sum of the total length of the plurality of curved portions and a total length of the plurality of straight portions,
   wherein, in the plan view, each straight portion is located outward in relation to ends of the curved portions located on opposite sides of the straight portion, the ends of the curved portions being located adjacent to the straight portion, and
   wherein, in the plan view, the plurality of curved portions constitute portions of an imaginary curved shape, at least one of the plurality of straight portions is located outward of the imaginary curved shape, and the imaginary curved shape contacts the at least one of the plurality of straight portions.

2. The wiring substrate according to claim 1, wherein, in the plan view, the plurality of curved portions correspond to a plurality of portions of an imaginary true circle, an imaginary ellipse, or an imaginary elongated circle which represents a product outline.

3. The wiring substrate according to claim 1, wherein the substrate body is composed of a plurality of insulating layers stacked together, and at least one of the insulating layers defines recesses which are formed at the straight portions and are open toward an outside of the straight portions in the plan view.

4. A method of manufacturing a wiring substrate comprising a substrate body formed of an insulating material and having a front surface, a back surface, and a side surface located between the front surface and the back surface, wherein, in a plan view which is a view from the front surface, an outline of the substrate body includes a plurality of curved portions separated from one another and a plurality of straight portions each located between adjacent ones of the plurality of curved portions, wherein, in the plan view, a total length of the plurality of curved portions is at least 40% of a sum of the total length of the plurality of curved portions and a total length of the plurality of straight portions, wherein, in the plan view, each straight portion is located outward in relation to ends of the curved portions located on opposite sides of the straight portion, the ends of the curved portions being located adjacent to the straight portion, and wherein, in the plan view, the plurality of curved portions constitute portions of an imaginary curved shape, at least one of the plurality of straight portions is located outward of the imaginary curved shape, and the imaginary curved shape contacts the at least one of the plurality of straight portions, the method comprising:

a blanking step of performing a blanking process on a mother substrate formed of an insulating material and having a front surface and a back surface, with an imaginary product outline set on the mother substrate, through use of a punch having a curved concave side surface corresponding to the plurality of curved portions which correspond to a portion of the imaginary product outline and a die having a receiving hole for receiving a distal end portion of the punch, thereby forming, on an outer side of the imaginary product outline of the mother substrate in the plan view, a plurality of through holes which are separated from one another and in which curved portions of the plurality of through holes are located along respective portions of the product outline; and a cutting step of cutting portions of the mother substrate which extend along the imaginary product outline between adjacent ones of the curved portions of the plurality of through holes separated from one another, thereby forming the straight portions.

5. The method of manufacturing a wiring substrate according to claim 4, wherein, in the blanking step, a plurality of the punches each having a curved concave side surface corresponding to one of the plurality of curved portions are disposed at positions which are point symmetrical with one another with respect to a center of the imaginary product outline in the plan view.

6. The method of manufacturing a wiring substrate according to claim 4, wherein, in the cutting step, cutting is performed by inserting a cutter having a straight cutting edge into the portions of the mother substrate which extend along the imaginary product outline between adjacent ones of the curved portions in the plurality of through holes, and wherein, the mother substrate is composed of a plurality of insulating layers, and before formation of the straight portions, a second blanking process is performed on at least one of a plurality of insulating layers, through use of a second punch and a second die different from the punch and the die used for formation of the through holes, the second blanking process performed in regions intersecting with the straight portions in the plan view.

7. The wiring substrate according to claim 1, wherein, in the plan view, each of the plurality of straight portions is located outward of the imaginary curved shape.

* * * * *